US006882548B1

(12) United States Patent
Jacobs et al.

(10) Patent No.: US 6,882,548 B1
(45) Date of Patent: Apr. 19, 2005

(54) AUXILIARY ACTIVE CLAMP CIRCUIT, A METHOD OF CLAMPING A VOLTAGE OF A RECTIFIER SWITCH AND A POWER CONVERTER EMPLOYING THE CIRCUIT OR METHOD

(75) Inventors: Mark E. Jacobs, Dallas, TX (US); Subarna Pal, Mesquite, TX (US); John F. Steel, Plano, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 33 days.

(21) Appl. No.: 10/373,418

(22) Filed: Feb. 24, 2003

(51) Int. Cl.$^7$ .............................................. H02M 3/335
(52) U.S. Cl. ................................ 363/21.06; 363/56.11; 363/56.12; 363/127
(58) Field of Search .......................... 363/21.06, 21.14, 363/56.05, 56.08, 56.11, 56.12, 89, 127

(56) References Cited

U.S. PATENT DOCUMENTS

| 5,099,406 | A | * | 3/1992 | Harada et al. ................ 363/20 |
| 5,636,107 | A | | 6/1997 | Lu et al. |
| 5,781,420 | A | | 7/1998 | Xia et al. |
| RE36,098 | E | | 2/1999 | Vinciarelli |
| 5,886,881 | A | * | 3/1999 | Xia et al. ................ 363/21.06 |
| 5,986,899 | A | | 11/1999 | Xia et al. |
| RE36,571 | E | | 2/2000 | Rozman |
| 6,141,224 | A | | 10/2000 | Xia et al. |
| 6,239,989 | B1 | * | 5/2001 | Ming-Ching ................ 363/20 |
| 6,278,621 | B1 | | 8/2001 | Xia et al. |

OTHER PUBLICATIONS

V. Vlatkovic, et al. "High–Voltage, High Power, ZVS, Full–Bridge PWM Converter Employing an Active Snubber" Proc. IEEE Applied Power Electronics Conf.; Mar. 1991; pp. 158–163.

G. Hua, et al. "An Improved Zero–Voltage–Switched PWM Converter Using a Saturable Inductor" IEEE Power Electronics Specialists Conf. Rec.; 1991; pp. 189–194.

K. Harada, et al. "Switched Snubber for High Frequency Switching" IEEE Power Electronics Specialists Conf.; 1990; pp. 181–188.

R. Redl, et al. "A Novel Soft–Switching Full–Bridge DC/DC Converter: Analysis, Design Considerations and Experimental Results at 1.5 kW, 100 kHz" IEEE Power Electronics Specialists Conf. Rec.; 1990; pp. 162–172.

L.H. Mweene, et al. "A 1 kw, 500 kHz, Front–End Converter for a Distributed Power Supply System" Proc. IEEE Applied Power Electronis Conf.; Mar. 1989; pp. 423–432.

* cited by examiner

*Primary Examiner*—Jeffrey Sterrett (57) ABSTRACT

The present invention is directed to an auxiliary active clamp circuit and a method of clamping a voltage of a rectifier switch associated with a power converter. The power converter includes a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the auxiliary active clamp circuit includes an auxiliary clamp capacitor, coupled across the rectifier switch, that stores a clamping voltage substantially equal to an off-state voltage of the rectifier switch. The auxiliary active clamp circuit also includes an auxiliary clamp switch, coupled in series with the auxiliary clamp capacitor, that receives a drive signal from a secondary winding and conducts during the main conduction period thereby clamping a voltage across the rectifier switch at about the clamping voltage.

20 Claims, 3 Drawing Sheets

AUXILIARY ACTIVE CLAMP CIRCUIT, A METHOD OF CLAMPING A VOLTAGE OF A RECTIFIER SWITCH AND A POWER CONVERTER EMPLOYING THE CIRCUIT OR METHOD

TECHNICAL FIELD OF THE INVENTION

The present invention is directed, in general, to power electronics and, more specifically, to an auxiliary active clamp circuit, method of clamping a voltage of a rectifier switch associated with a power converter and a power converter employing the circuit and method.

BACKGROUND OF THE INVENTION

A power converter is a power processing circuit that converts an input voltage waveform into: a specified output voltage waveform. In many applications requiring a DC output, switched-mode DC/DC power converters are frequently employed to advantage. The switched-mode DC/DC power converters generally include an inverter, an input/output isolation transformer and a rectifier on a secondary side of the isolation transformer. The inverter generally includes a main power switch, such as a field effect transistor ("FET"), that converts the DC input voltage to an AC voltage. The input/output isolation transformer, then, transforms the AC voltage to another value and the rectifier generates the desired DC voltage at the output of the power converter. Conventionally, the rectifier includes a plurality of rectifier switches (e.g., diodes, or FETs acting as synchronous rectifier switches) that conduct the load current in response to the input waveform thereto.

The main power switch and rectifier switches are usually operated at relatively high switching frequencies such as 200–300 kHz to allow the use of smaller components such as inductors and capacitors within the power converter. As a result, parasitic or stray inductance or capacitance associated with the components of the power converter can be reduced.

The residual parasitic elements mentioned above, however, may generate high frequency oscillations that appear as undesired "ringing" waveforms in the power converter associated with the switching transitions, particularly, those associated with the transformer and switches. The ringing waveforms, which are superimposed on the waveforms associated with the normal operation of the power converter, prompt the use of higher rated and higher cost circuit components to operate in such an environment. Additionally, the deleterious ringing waveforms cause the power converter to be more lossy and less efficient. Some of the loss manifests itself as undesirable electromagnetic interference (EMI) causing regulatory problems which must be addressed. Due to the relatively small resistance values inherent in the transformer and inductor elements, the ringing energy may only be lightly damped in the power converter.

The spurious ringing necessitates that a rectifier switch with a higher peak inverse voltage rating be employed in the power converter. For example, it the rectifier switch is employed in a power converter with a steady state output voltage of about two to three volts and, during a transition, the rectifier switch endures a reverse voltage spike causing perhaps a 80–90% rise in the off-state voltage of the rectifier switch, then the rectifier switch must be rated for roughly twice the peak inverse voltage rating (e.g., 30 volts) that it would otherwise require to avoid being damaged.

This problem is particularly severe for rectifier switches that conduct during an auxiliary conduction period (i.e., when the main power switch is not conducting; also referred to a "reset" portion of the switching cycle) of the power converter. During this period, the reverse voltage sustained by the rectifying switch is the input voltage of the power converter multiplied by the turns ratio of the transformer, which can be unavoidably high for higher input voltages. In addition, when the higher reverse voltage is superimposed on the non-zero voltage turn-on of the main power switch, the power converter is subject to voltage stresses that may further compromise the design thereof.

While employing a rectifier switch with a 30 volt peak inverse voltage rating in a two to three volt power converter may be acceptable because of the scarcity of commercially available and economical rectifier switches with lower voltage ratings, the problem is exacerbated in power converters with a higher steady state output voltage (e.g., 24 or 48 volts). In such circumstances, the rectifier switch may be subject to a reverse voltage spike of 200 volts or more. While it is possible to employ rectifier switches with higher peak inverse voltage ratings (even with the higher cost and poorer performance characteristics), the benefits of exploring other circuit alternatives outweighs accepting such losses and poor efficiencies associated with using such devices.

Conventional ways of reducing the spurious ringing in the power converter include a snubber circuit placed across each rectifier switch which consists of, in one example, a resistor connected in series with a capacitor. The snubber acts as a damping device to reduce the ringing amplitude by dissipating a portion of the ringing energy. While the snubber circuit reduces the effects of the spurious ringing associated with the rectifier switch allowing lower rated devices to be used, it also reduces the overall efficiency of the power converter. More specifically, the snubber capacitor causes more current to flow through the switches of the power converter when it conducts providing additional energy losses therein. Analogous drawbacks are provided by other passive snubber approaches such as circuits employing a diode in series with a capacitor to absorb the reverse voltage spike, and a resistor to dissipate the energy accumulated in the capacitor.

A further technique for reducing the ringing waveforms in the power converter is to place a saturable reactor in series with the rectifier switch. The saturable reactor is a nonlinear inductor that adopts a lossy characteristic change as the current therethrough increases to a point where the magnetic core material saturates. The saturation characteristic can damp the ringing waveforms by dissipating some of the ringing energy (and reducing the EMI), but it tends to become physically hot and, as a result, is often impractical to use in the power converter.

Other damping circuits such as active snubber circuits may also be used in a variety of schemes to reduce the ringing waveforms. Examples of active snubber circuits are illustrated and described in L. H. Mweene, et al., *A 1 kW, 500 kHz, front-end converter for a distributed power supply system*, Proc. IEEE Applied Power Electronics Conf., March 1989, pp. 423–432; R. Redl, et al., *A novel soft-switching full-bridge dc/dc converter: analysis, design considerations and experimental results at 1.5 kW, 100 kHz*, IEEE Power Electronics Specialists Conf. Rec., 1990, pp. 162–172; G. Hua, et al., *An improved zero-voltage-switched PWM converter using a saturable inductor*, IEEE Power Electronics Specialists Conf. Rec., 1991, pp. 189–194; K. Harada, et al., *Switched snubber for high frequency switching*, IEEE Power Electronics Specialists Conf., 1990, pp., 181–188; V. Vlatkovic, et al., *High-voltage, high-power, ZVS, full-bridge PWM converter employing an active snubber*, Proc. IEEE Applied Power Electronics Conf., March, 1991, pp. 158–163. The aforementioned references are incorporated herein by reference.

Still further examples employing active snubber circuits including switches coupled to the windings of the transformer to reduce the ringing waveforms are described in U.S. Pat. No. 5,636,107 entitled DC—DC Converters, by Lu, et al., U.S. Pat. No. 5,781,420 entitled Single ended forward DC-to-DC converter providing enhanced resetting for synchronous rectification, by Xia, et al., U.S. Pat. No. 5,986,899 entitled Single ended forward DC-to-DC converter providing enhanced resetting for synchronous rectification, by Xia, et al., U.S. Pat. No. 6,141,224 entitled Single ended forward DC-to-DC converter providing enhanced resetting for synchronous rectification, by Xia, et al., U.S. Pat. No. 6,278,621 entitled Single ended forward DC-to-DC converter providing enhanced resetting for synchronous rectification, by Xia, et al., which are incorporated herein by reference. Lu, et al. disclose a series-coupled switch and capacitor that clamps a voltage across the secondary winding of the transformer. Unfortunately, the effectiveness of Lu, et al. is limited because portions of the active snubber circuit are in series with ones of components of the power converter to be protected. This limitation is especially pronounced for reverse voltages exhibiting wider pulses. While the Xia, et al. references disclose active snubber circuits located across the rectifier switches, these circuits are typically enabled during the auxiliary conduction period and principally act to reset the flux in the core of the transformer.

While presently available active circuits analogous to the active snubber circuits have been employed with the main power switch of the inverter of the power converter (see, for instance, U.S. Pat. No. Re 36,098, entitled Optimal Resetting of the Transformer's Core in Single-ended Forward Converters, by Vinciarelli, which is incorporated herein by reference), such techniques have not been applied directly to a rectifier switch that substantially conducts during the auxiliary conduction period employing a control voltage from the transformer, thereby allowing the efficient use of a rectifier switch with a lower voltage rating and with fewer circuit components.

Accordingly, what is needed in the art is a robust solution and circuit to reduce the undesirable ringing waveforms associated with the rectifier switch in the power converter without significantly affecting the efficiency thereof.

SUMMARY OF THE INVENTION

To address the above-discussed deficiencies of the prior art, the present invention provides an auxiliary active clamp circuit for use with a power converter. The power converter includes a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the auxiliary active clamp circuit includes an auxiliary clamp capacitor, coupled across the rectifier switch, that stores a clamping voltage substantially equal to an off-state voltage of the rectifier switch. The auxiliary active clamp circuit also includes an auxiliary clamp switch, coupled in series with the auxiliary clamp capacitor, that receives a drive signal from a secondary winding and conducts during the main conduction period thereby clamping a voltage across the rectifier switch at about the clamping voltage.

In another aspect, the present invention provides a method of clamping a voltage of a rectifier switch associated with a power converter. The power converter includes a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the method includes storing a clamping voltage substantially equal to an off-state voltage of the rectifier switch. The method also includes providing a drive signal from a secondary winding to an auxiliary clamp switch. The method further includes causing an auxiliary clamp switch to conduct during the main conduction period. The method still further includes clamping a voltage across the rectifier switch at about the clamping voltage.

In yet another aspect, the present invention provides a power converter that accepts an input voltage at an input thereof and provides an output voltage at an output thereof. In one embodiment, the power converter includes a main power switch coupled to the input with a main active clamp circuit associated therewith. The power converter also includes a transformer having a primary winding coupled to the main power switch and a rectifier, coupled to a secondary winding of the transformer, that includes a rectifier switch (e.g., first rectifier switch). The main power switch conducts during a main conduction period of the power converter and the rectifier switch conducts during an auxiliary conduction period of the power converter. The power converter still further includes an auxiliary active clamp circuit (e.g., first auxiliary active clamp circuit) associated with the first rectifier switch.

In one embodiment, the first auxiliary active clamp circuit includes an auxiliary clamp capacitor (e.g., first auxiliary clamp capacitor), coupled across the first rectifier switch, that stores a clamping voltage substantially equal to an off-state voltage of the first rectifier switch. The first auxiliary active clamp circuit also includes an auxiliary clamp switch (e.g., first auxiliary clamp switch), coupled in series with the first auxiliary clamp capacitor, that receives a drive signal from a secondary winding and conducts during the main conduction period thereby clamping a voltage across the first rectifier switch at about the clamping voltage.

Alternatively, the rectifier includes another rectifier switch (e.g., second rectifier switch) and the power converter includes another auxiliary active clamp circuit (e.g., second auxiliary active clamp circuit) associated with the second rectifier switch. The second auxiliary active clamp circuit includes another auxiliary clamp capacitor (e.g., second auxiliary clamp capacitor), coupled across the second rectifier switch, that stores a clamping voltage substantially equal to an off-state voltage of the second rectifier switch. The second auxiliary active clamp circuit also includes another auxiliary clamp switch (e.g., second auxiliary clamp switch), coupled in series with the second auxiliary clamp capacitor, that clamps a voltage across the second rectifier switch at about the clamping voltage.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
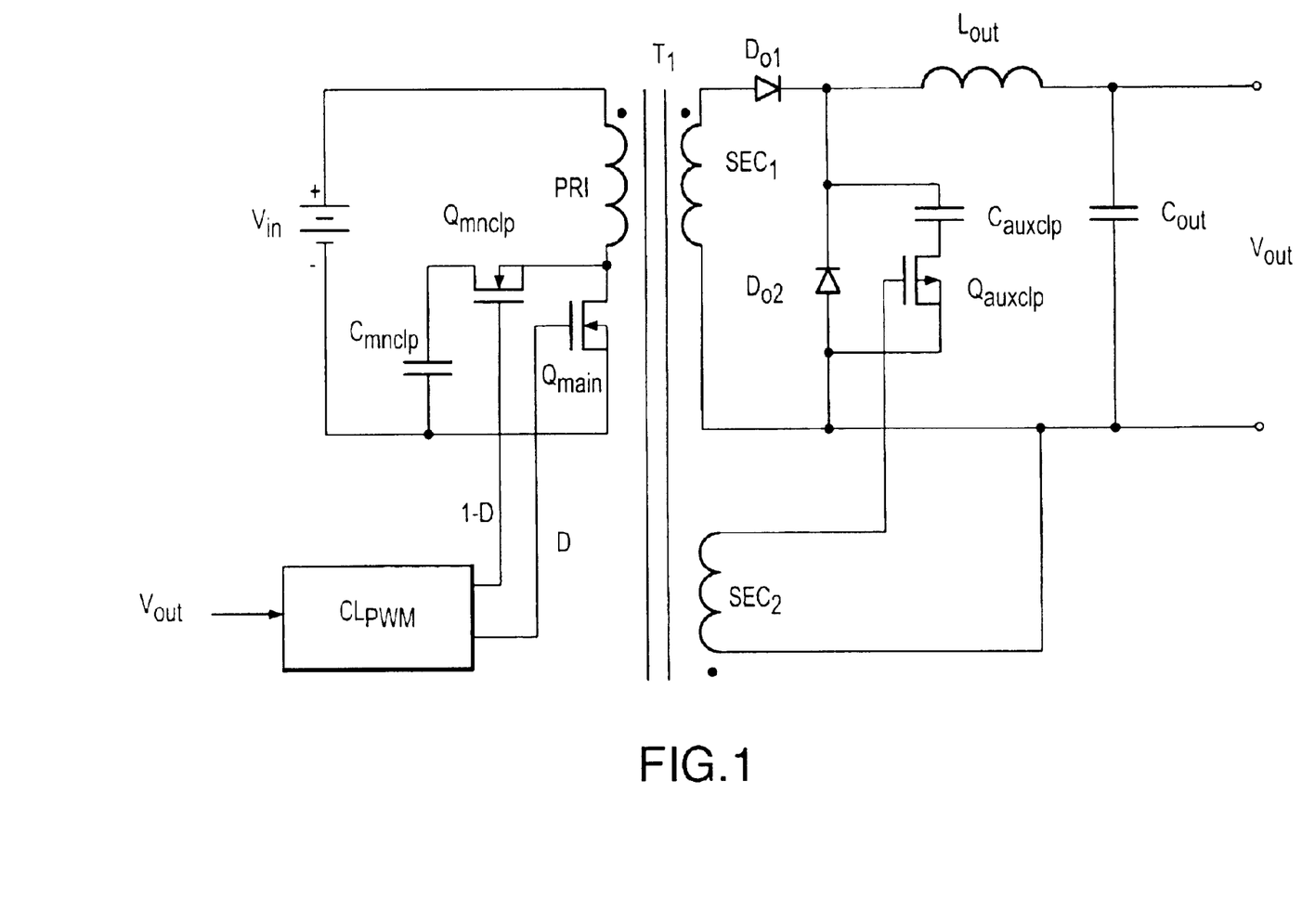
FIG. 1 illustrates a schematic diagram of an embodiment of a power converter constructed according to the principles of the present invention.

Referring initially to FIG. 1, illustrated is a schematic diagram of an embodiment of a power converter constructed according to the principles of the present invention. The power converter includes a primary power circuit or inverter driven by a controller (e.g., a pulse width modulator controller) $CL_{PWM}$, a secondary power circuit and a transformer $T_1$ having a primary winding PRI and first and second secondary windings $SEC_1$, $SEC_2$.

The primary power circuit is coupled to a source of input voltage $V_{in}$ and the primary winding PRI of the transformer $T_1$ and includes a main power switch $Q_{main}$ and a main clamp switch $Q_{mnclp}$ that is series-coupled to a main clamp capacitor $C_{mnclp}$ having a clamping voltage thereacross. In the illustrated embodiment, the main clamp switch $Q_{main}$ and the main clamp capacitor $C_{mnclp}$ form a main active clamp circuit, which also functions as a main active clamp transformer reset circuit. It should be understood by those skilled in the art that the main active clamp circuit may be positioned at other locations within the power converter such as coupled to one of the first and second secondary windings $SEC_1$, $SEC_2$ of the transformer $T_1$, or coupled to an additional winding (not shown) of the transformer $T_1$ (see, for instance, U.S. Pat. No. Re 36,098 to Vinciarelli).

For the transformer winding senses shown in FIG. 1, the primary power circuit transfers power forward from the primary winding PRI to the first and second secondary windings $SEC_1$, $SEC_2$ during conduction of the main power switch $Q_{main}$ thereby providing a forward portion of an overall switching cycle {represented by a (D) portion of an overall switching cycle}. The main power switch $Q_{main}$ connects the input voltage $V_{in}$ across the primary winding PRI for a main conduction period {also represented by a (D) portion of an overall switching cycle}. At the conclusion of the main conduction period D, the primary winding PRI is coupled across a difference between the input voltage $V_{in}$ and the clamping voltage across the main clamp capacitor $C_{mnclp}$.

This action is accomplished by the main clamp switch $Q_{mnclp}$ which conducts for an auxiliary conduction period {represented by a (1-D) portion of an overall switching cycle}. The auxiliary conduction period 1-D represents a transformer reset portion of the overall switching cycle that is substantially mutually exclusive of the main conduction period D. Of course, one skilled in the pertinent art realizes that there may be a small overlap or a small gap in the main conduction period D and auxiliary conduction period 1-D due to associated transition times or switching delays. The main clamp capacitor $C_{mnclp}$ allows the magnetic flux through the core of the transformer $T_1$ to be substantially reset to a value exhibited at the beginning of the main conduction period D. Both the main conduction period D and the auxiliary conduction period 1-D are controlled by the controller $CL_{PWM}$. For additional information concerning the operation of main power switch and main clamp switch see, for instance, U.S. Pat. No. Re 36,571, entitled Low loss synchronous rectifier for application to clamped-mode power converters, to Rozman, which is incorporated herein by reference.

The secondary power circuit, coupled to the first and second secondary windings $SEC_1$, $SEC_2$ of the transformer $T_1$, provides an output voltage $V_{out}$ and includes first and second rectifier switches (e.g., first and second output diodes $D_{o1}$, $D_{o2}$), an output inductor $L_{out}$ and an output capacitor $C_{out}$. For the transformer winding senses shown in FIG. 1, the secondary power circuit couples a secondary voltage associated with the first secondary winding $SEC_1$ to the first output diode $D_{o1}$ during the main conduction period D.

The secondary voltage is coupled through the first output diode $D_{o1}$ to the output inductor $L_{out}$. Then, during the auxiliary conduction period 1-D, an output inductor current flows through the second output diode $D_{o2}$. A DC portion of the output inductor current flows through a load (not shown) connected to an output of the power converter. An AC portion of the output inductor current flows through the output capacitor $C_{out}$, which provides a filtering function for the output voltage $V_{out}$.

The secondary power circuit also includes an auxiliary active clamp circuit including an auxiliary clamp switch $Q_{auxclp}$ (represented as a p-channel FET) and an auxiliary clamp capacitor $C_{auxclp}$ coupled across the second output diode $D_{o2}$. Whereas the main active clamp circuit resets the core of the transformer $T_1$ during the auxiliary conduction period 1-D of the power converter, the auxiliary active clamp circuit clamps a voltage across the second output diode $D_{o2}$ at a clamping voltage during the main conduction period D of the power converter. The clamping voltage is substantially equal to an off-state voltage of the rectifier switch (in this case, the second output diode $D_{o2}$) that the auxiliary active clamp circuit is coupled to.

During a switching transition of the rectifier switches (in this case, the first and second output diodes $D_{o1}$, $D_{o2}$) from a conducting to a non-conducting state, the rectifier switches are subject to a reverse voltage that, if left unchecked, causes deleterious ringing waveforms in the power converter. The auxiliary active clamp circuit is employed to substantially reduce the adverse effects associated with the reverse voltage phenomena, particularly across second output diode $D_{o2}$.

The auxiliary active clamp circuit generally operates as follows. As mentioned above, during the auxiliary conduction period 1-D, the second output diode $D_{o2}$ is conducting, the auxiliary clamp switch $Q_{auxclp}$ is not conducting and a voltage substantially equal to, in this case, the input voltage $V_{in}$ multiplied by a secondary-to-primary turns ratio of the transformer $T_1$ builds across the auxiliary clamp capacitor $C_{auxclp}$. At the beginning of the main conduction period D, the second output diode $D_{o2}$ is transitioned to a non-conducting state and, preferably, at substantially the same time, the auxiliary clamp switch $Q_{auxclp}$ is transitioned to a conducting state. Even if the timing of the transition of the auxiliary clamp switch $Q_{auxclp}$ is delayed, the body diode of the auxiliary clamp switch $Q_{auxclp}$ conducts to allow the auxiliary active clamp circuit to serve its intended function. In the illustrated embodiment, the drive signal for the auxiliary clamp switch $Q_{auxclp}$ is derived from the second secondary winding $SEC_2$ of the transformer $T_1$.

As a result, the auxiliary active clamp circuit clamps a voltage across the second output diode $D_{o2}$ at the clamping voltage during the main conduction period D of the power converter. In this case, the clamping voltage is equal to the off-state voltage of the second output diode $D_{o2}$, which is approximately the input voltage $V_{in}$ multiplied by a secondary-to-primary turns ratio of the transformer $T_1$. It should be understood by those skilled in the art that variations in the operation of the auxiliary active clamp circuit (such as modifying the controllable conduction period of the auxiliary clamp switch $Q_{auxclp}$) and power converter, in general, is acceptable to enhance the operation thereof. Of course, the operational modifications still fall within the purview of the broad scope of the present invention.

Assuming for the sake of discussion that another auxiliary active clamp circuit is employed across the first output diode $D_{o1}$, then the clamping voltage associated with the first output voltage $D_{o1}$ would be the off-state voltage thereof. The off-state voltage of the first output diode $D_{o1}$, in this case, is approximately equal to a difference between the input voltage $V_{in}$ multiplied by a secondary-to-primary turns ratio of the transformer $T_1$ and a clamping voltage across the main clamp capacitor $C_{mnclp}$ during the auxiliary conduction period 1-D. In other terms, the off-state voltage of the first output diode $D_{o1}$ is proportional to the voltage that resets the magnetizing inductance of the transformer $T_1$. It should also be understood by those skilled in the art that since the voltage across the main clamp capacitor $C_{mnclp}$ is somewhat variable during a switching cycle, the off-state voltage associated with the first output diode $D_{o1}$ may be somewhat variable. In general, therefore, the value of the off-state voltage is a function of the operation of the power converter employing the rectifier switch and the characteristics of the rectifier switch itself.

Again, for the sake of clarity, immediately following a transition from a conducting to a non-conducting state, rectifier switches that do not employ a clamp or snubber generally sustain a brief spike in reverse voltage that is substantially larger than its normal operating off-state voltage. The voltage spike is an unavoidable consequence of the rectifier switch and the circuit parasitic capacitance resonating with circuit parasitic inductances. This phenomenon often results in a need for rectifier switches having a higher inverse peak voltage rating than the off-state voltage thereof, with unfavorable consequences to the cost of circuit components and power converter performance. Applying the principles of the present invention to power converters employing rectifier switches alleviates the deleterious effects associated with the reverse voltage spikes.

The auxiliary active clamp circuit can provide other benefits to the power converter as well. For instance, the auxiliary active clamp circuit can facilitate a recycling of energy associated with a parasitic capacitance of the rectifier switch (in this case, the second output diode $D_{o2}$) that the auxiliary active clamp circuit is serving. More specifically, a portion of the energy stored in the auxiliary clamp capacitor $C_{auxclp}$ (corresponding to the clamping voltage), which is employed to clamp the voltage across the first output diode $D_{o1}$ during the main conduction period D, can also be recycled within the power converter. As a result, the efficiency of the power converter (e.g., a percent or more improvement for a 24 volt power converter at normal operating conditions) is further enhanced by this ancillary benefit associated with the auxiliary active clamp circuit of the present invention.

Figure 2:
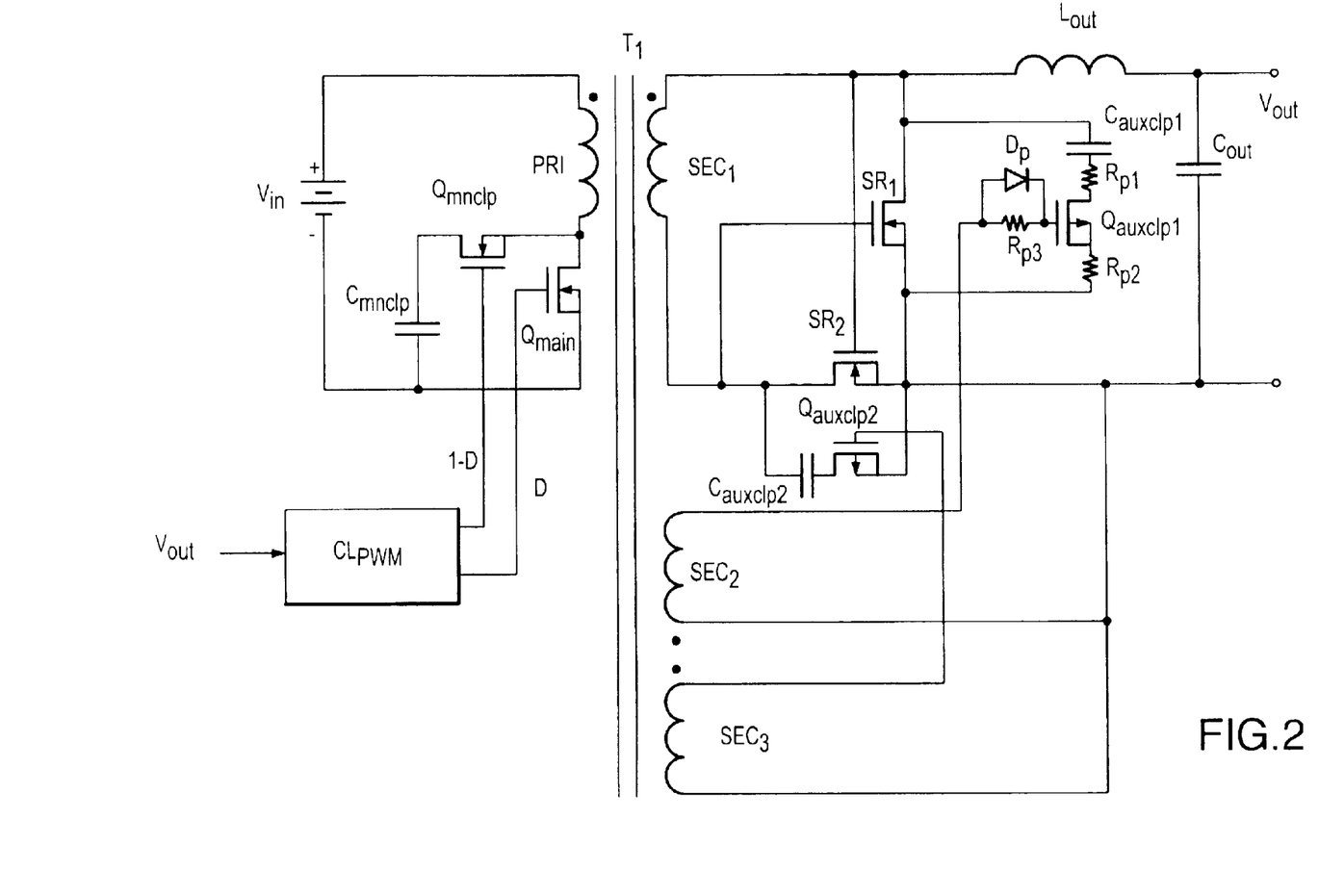
FIG. 2 illustrates a schematic diagram of another embodiment of a power converter constructed according to the principles of the present invention.

Turning now to FIG. 2, illustrated is a schematic diagram of another embodiment of a power converter constructed according to the principles of the present invention. The power converter includes a primary power circuit or inverter driven by a controller (e.g., a pulse width modulator controller) $CL_{PWM}$, a secondary power circuit and a transformer $T_1$ having a primary winding PRI and first, second and third secondary windings $SEC_1$, $SEC_2$, $SEC_3$.

The primary power circuit is coupled to a source of input voltage $V_{in}$ and the primary winding PRI of the transformer $T_1$ and includes a main power switch $Q_{main}$ and a main clamp switch $Q_{mnclp}$ that is series-coupled to a main clamp capacitor $C_{mnclp}$ having a clamping voltage thereacross. In the illustrated embodiment, the main clamp switch $Q_{main}$ and the main clamp capacitor $C_{mnclp}$ form a main active clamp circuit, which also functions as a main active clamp transformer reset circuit. As previously mentioned, it should be understood by those skilled in the art that the main active clamp circuit may be positioned at other locations within the power converter.

For the transformer winding senses shown in FIG. 2, the primary power circuit transfers power forward from the primary winding PRI to the first, second and third secondary windings $SEC_1$, $SEC_2$, $SEC_3$ during conduction of the main power switch $Q_{main}$ thereby providing a forward portion of an overall switching cycle (represented by a (D) portion of an overall switching cycle). The main power switch $Q_{main}$ connects the input voltage $V_{in}$ across the primary winding PRI for a main conduction period {again, represented by a (D) portion of an overall switching cycle}. At the conclusion of the main conduction period D, the primary winding PRI is coupled across a difference between the input voltage $V_{in}$ and the clamping voltage across the main clamp capacitor $C_{mnclp}$.

This action is accomplished by the main clamp switch $Q_{mnclp}$, which conducts for an auxiliary conduction period {represented by a (1-D) portion of an overall switching cycle}. The auxiliary conduction period 1-D represents a transformer reset portion of the overall switching cycle that is substantially mutually exclusive of the main conduction period D. Of course, one skilled in the pertinent art realizes that there may be a small overlap or a small gap in the main conduction period D and auxiliary conduction period 1-D due to associated transition times or switching delays. The main clamp capacitor $C_{mnclp}$ allows the magnetic flux through the core of the transformer $T_1$ to be substantially reset to a value exhibited at the beginning of the main conduction period D. Both the main conduction period D and the auxiliary conduction period 1-D are controlled by the controller $CL_{PWM}$. For additional information concerning the operation of main power switch and main clamp switch see U.S. Pat. No. Re 36,571 to Rozman.

The secondary power circuit, coupled to the first, second and third secondary windings $SEC_1$, $SEC_2$, $SEC_3$ of the transformer $T_1$, provides an output voltage $V_{out}$ and includes first and second rectifier switches (e.g., first and second synchronous rectifier switches $SR_1$, $SR_2$), an output inductor $L_{out}$ and an output capacitor $C_{out}$. For the transformer winding senses shown in FIG. 2, the secondary power circuit couples a secondary voltage associated with the first secondary winding $SEC_1$ to the second synchronous rectifier switch $SR_2$ during the main conduction period D.

The secondary voltage is coupled through the second synchronous rectifier switch $SR_2$ to the output inductor $L_{out}$. Then, during the auxiliary conduction period 1-D, an output inductor current flows through the first synchronous rectifier switch $SR_1$. A DC portion of the output inductor current flows through a load (not shown) connected to an output of the power converter. An AC portion of the output inductor current flows through the output capacitor $C_{out}$, which provides a filtering function for the output voltage $V_{out}$.

The secondary power circuit also includes a first auxiliary active clamp circuit including a first auxiliary clamp switch $Q_{auxclp1}$ and a first auxiliary clamp capacitor $C_{auxclp1}$ coupled across the first synchronous rectifier switch $SR_1$. The first auxiliary active clamp circuit also includes a protection circuit formed with a diode $D_p$ and first, second and third resistors $R_{p1}$, $R_{p2}$, $R_{p3}$. The secondary power circuit also includes a second auxiliary active clamp circuit including a second auxiliary clamp switch $Q_{auxclp2}$ and a second auxiliary clamp capacitor $C_{auxclp2}$ coupled across the second synchronous rectifier switch $SR_2$. Whereas the main active clamp circuit resets the core of the transformer $T_1$ during the auxiliary conduction period 1-D of the power converter, the first and second auxiliary active clamp circuits clamp a voltage across the respective first and second synchronous rectifier switches $SR_1$, $SR_2$ at a clamping voltage during one of the main conduction period D and auxiliary conduction period 1-D of the power converter. The clamping voltage is substantially equal to an off-state voltage of the rectifier switch (in this case, one of the first and second synchronous rectifier switches SR1, $SR_2$) that the auxiliary active clamp circuit is coupled to. Additionally, in the illustrated embodiment, the second auxiliary active clamp circuit assists the main active clamp circuit in resetting the core of the transformer $T_1$.

During a switching transition of the rectifier switches (in this case, the first and second synchronous rectifier switches $SR_1$, $SR_2$) from a conducting to a non-conducting state, the rectifier switches are subject to a reverse voltage that, if left unchecked, causes deleterious ringing waveforms in the power converter. The first and second auxiliary active clamp circuits are employed to substantially reduce the adverse effects associated with the reverse voltage phenomenon.

The first and second auxiliary active clamp circuits generally operate as follows. As mentioned above, during the main conduction period D, the second synchronous rectifier switch $SR_2$ is conducting, the second auxiliary clamp switch $Q_{auxclp2}$ is not conducting and a voltage substantially equal to, in this case, a difference between the input voltage $V_{in}$ and a clamping voltage across the main clamp capacitor $C_{mnclp}$ multiplied by a secondary-to-primary turns ratio of the transformer $T_1$ has already been established across the second auxiliary clamp capacitor $C_{auxclp2}$. At approximately the beginning of the auxiliary conduction period 1-D, the second synchronous rectifier switch $SR_2$ is transitioned to a non-conducting state and the second auxiliary clamp switch $Q_{auxclp2}$ is transitioned to a conducting state. Even if the timing of the transition of the second auxiliary clamp switch $Q_{auxclp2}$ is delayed, perhaps by a circuit similar to the protection circuit coupled to the first auxiliary clamp switch $Q_{auxclp1}$, the body diode of the second auxiliary clamp switch $Q_{auxclp2}$ conducts to allow the second auxiliary active clamp circuit to serve its intended function. The drive signal for the second auxiliary clamp switch $Q_{auxclp2}$ is derived from the third secondary winding $SEC_3$ of the transformer $T_1$. As a result, the second auxiliary active clamp circuit clamps a voltage across the second synchronous rectifier switch $SR_2$ at a clamping voltage during the auxiliary conduction period 1-D of the power converter. In this case, the clamping voltage is equal to the off-state voltage of the second synchronous rectifier switch $SR_2$.

Turning now to the first auxiliary active clamp circuit, during the auxiliary conduction period 1-D, the first synchronous rectifier switch $SR_1$ is conducting, the first auxiliary clamp switch $Q_{auxclp1}$ is not conducting and a voltage substantially equal to, in this case, the input voltage $V_{in}$ multiplied by a secondary-to-primary turns ratio of the transformer $T_1$ has already established across the first auxiliary clamp capacitor $C_{auxclp1}$. At the beginning of the main conduction period D, the first synchronous rectifier switch $SR_1$ is transitioned to a non-conducting state and the first auxiliary clamp switch $Q_{auxclp1}$ is transitioned to a conducting state. Even if the timing of the transition of the first auxiliary clamp switch $Q_{auxclp1}$ is delayed, the body diode of the first auxiliary clamp switch $Q_{auxclp1}$ conducts to allow the first auxiliary active clamp circuit to serve its intended function. The drive signal for the first auxiliary clamp switch $Q_{auxclp2}$ is derived from the second secondary winding $SEC_2$ of the transformer $T_1$.

Again, the first auxiliary active clamp circuit also includes a protection circuit formed with a diode $D_p$ and first, second and third resistors $R_{p1}$, $R_{p2}$, $R_{p3}$. Ones of the first and second resistors $R_{p1}$, $R_{p2}$ are in series with source and drain of the first auxiliary clamp switch $Q_{auxclp1}$. The first resistor $R_{p1}$ limits a shoot-through current through the first auxiliary clamp switch $Q_{auxclp1}$, which, if unchecked, could cause the first auxiliary clamp switch $Q_{auxclp1}$ to conduct excessively and discharge the first auxiliary clamp capacitor $C_{auxclp1}$. Similarly, the second resistor $R_{p2}$ limits a shoot-through current through the first auxiliary clamp switch $Q_{auxclp1}$. The diode $D_p$ and third resistor $R_{p3}$ delays a turn-on time of the first auxiliary clamp switch $Q_{auxclp1}$ to, again, limit a shoot-through current through the first auxiliary clamp switch $Q_{auxclp1}$.

As a result, the first auxiliary active clamp circuit clamps a voltage across the first synchronous rectifier switch $SR_1$ at the clamping voltage during the auxiliary conduction period 1-D of the power converter. In this case, the clamping voltage is equal to the off-state voltage of the first synchronous rectifier switch $SR_1$, which is approximately the input voltage $V_{in}$ multiplied by a secondary-to-primary turns ratio of the transformer $T_1$. In general, the value of the off-state voltage is a function of the operation of the power converter employing the rectifier switch.

Again, it should be understood by those skilled in the art that variations in the operation of the first and second auxiliary active clamp circuits (such as modifying the conduction period of the first and second auxiliary clamp switches $Q_{auxclp1}$, $Q_{auxclp2}$) and power converter, in general, is acceptable to enhance the operation thereof. Of course, the operational modifications still fall within the purview of the broad scope of the present invention. Thus, applying the principles of the present invention to power converters employing rectifier switches alleviates the deleterious effects associated with the reverse voltage spikes that generally occur immediately following a transition from a conducting to a non-conducting state of the rectifier switches.

As described above, the first and second auxiliary active clamp circuits can provide other benefits to the power converter operation as well such as recycling energy associated with the parasitic capacitance of the rectifier switch (in this case, the first and second synchronous rectifier switches $SR_1$, $SR_2$) that the first and second auxiliary active clamp circuits are serving. As a result, the efficiency of the power converter is further enhanced by this ancillary benefit associated with the first and second auxiliary active clamp circuits of the present invention. It should be clear to one skilled in the art that, depending on the application, only one of the first and second auxiliary active clamp circuits may be employed and still provide an enhanced efficiency to the power converter.

Figure 3:
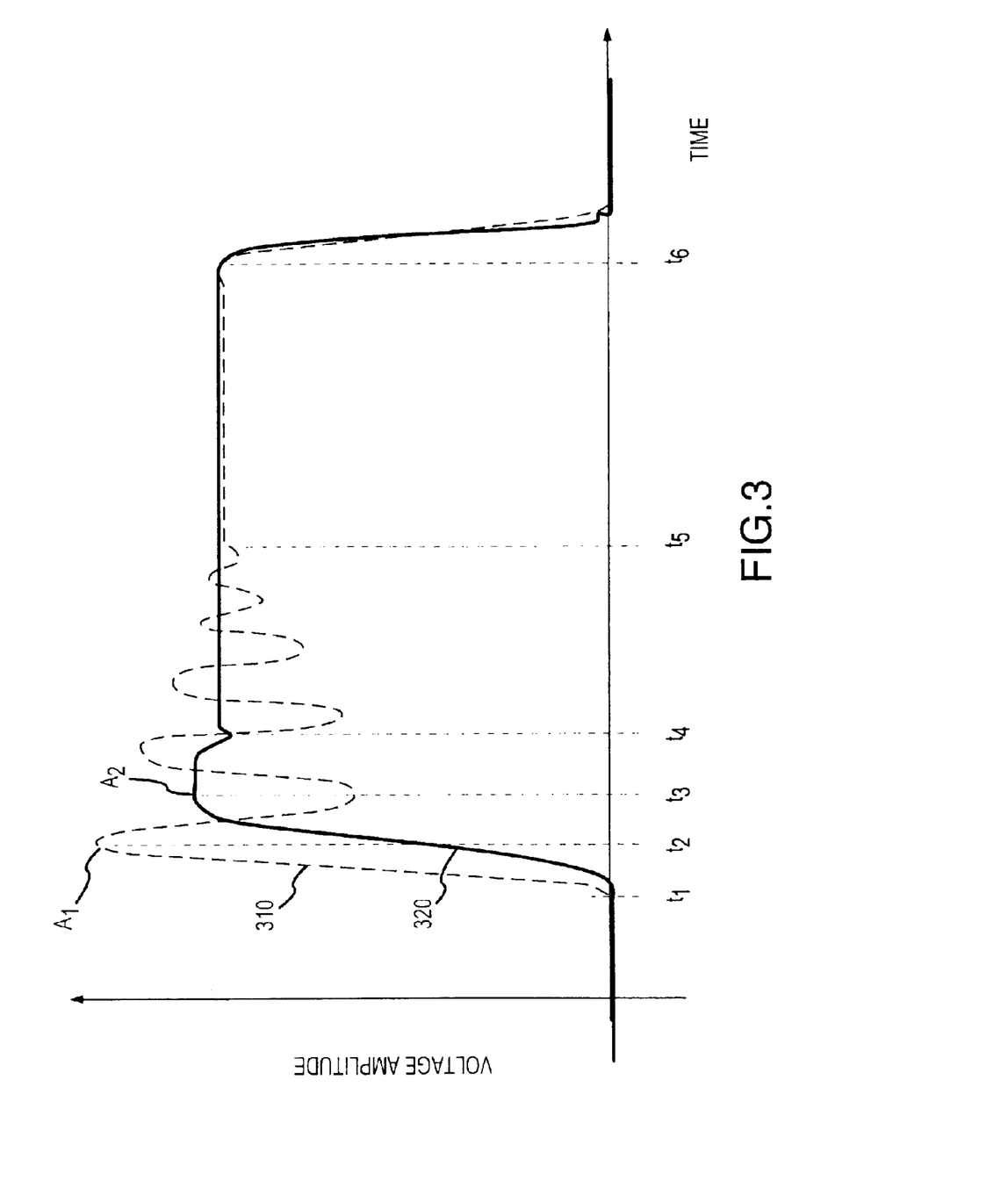
FIG. 3 illustrates a waveform diagram demonstrating exemplary advantages in accordance with the principles of the present invention.

Turning now to FIG. 3, illustrated is a waveform diagram demonstrating exemplary advantages in accordance with the principles of the present invention. The diagram provides an illustration of an exemplary reduction in a reverse voltage spike measured across a rectifier switch of a power converter. The first waveform 310 illustrates a reverse voltage spike without employing an auxiliary active clamp circuit in accordance with the principles of the present invention. The second waveform 320 illustrates a reduction in the reverse voltage spike when employing an auxiliary active clamp circuit in accordance with the principles of the present invention.

More specifically, at a time $t_1$, a rectifier switch is transitioned from a conducting to a non-conducting state and the reverse voltage thereacross begins to steadily climb. At a time $t_2$, the first waveform 310 demonstrates that the reverse voltage spike reaches a first amplitude $A_1$. Conversely, at a time $t_3$, the second waveform 320 demonstrates that the reverse voltage spike reaches a second amplitude $A_2$, which is substantially less than the first amplitude $A_1$. The reduction in the reverse voltage spike is quite substantial for the design of a power converter. For instance, for a 24 volt power converter, the reverse voltage spike of a rectifier switch may be reduced from 100 volts or more to somewhat higher than the off-state voltage of the rectifier switch (perhaps 25 percent over the off-state voltage thereof; i.e., about 25 percent higher than 60 volts, or about 75 volts). This, of course, can provide dramatic advantages to the operation of the power converter employing the auxiliary active clamp circuit to advantage.

Returning to the diagram, at a time $t_4$, the reverse voltage spike associated with the second waveform 320 falls to the off-state voltage of the rectifier switch. Conversely, the reverse voltage spike associated with the first waveform 310 does not fall to the off-state voltage of the rectifier switch until a time $t_5$. Finally, at a time $t_6$, the rectifier switch transitions from a non-conducting state to a conducting state and the voltage thereacross begins to fall.

Thus, an auxiliary active clamp circuit for use with a rectifier switch has been introduced into a power converter with readily attainable and quantifiable advantages. Those skilled in the art should understand that the previously described embodiments of the auxiliary active clamp circuit, method of operation thereof and power converter are submitted for illustrative purposes only and that other embodiments capable of mitigating the adverse effects of the reverse voltage phenomenon associated with the rectifier switch are well within the broad scope of the present invention.

Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power circuit topologies. For a better understanding of a variety of power converter topologies, see *Modern DC-to-DC Switchmode Power Converter Circuits*, by Rudolph P. Severns and Gordon Bloom, Van Nostrand Reinhold Company, New York, N.Y. (1985) and *Principles of Power Electronics*, by J. G. Kassakian, M. F. Schlecht and G. C. Verghese, Addison-Wesley (1991), which are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. For use with a power converter having a main active clamp circuit associated with a main power switch coupled to a primary winding of a transformer and a rectifier switch coupled to a secondary winding of said transformer, said main power switch configured to conduct during a main conduction period of said power converter and said rectifier switch configured to conduct during an auxiliary conduction period of said power converter, an auxiliary active clamp circuit, comprising:

an auxiliary clamp capacitor, coupled across said rectifier switch, configured to store a clamping voltage substantially equal to an off-state voltage of said rectifier switch; and an auxiliary clamp switch, coupled in series with said auxiliary clamp capacitor, configured to receive a drive signal from another secondary winding and conduct during said main conduction period thereby clamping a voltage across said rectifier switch at about said clamping voltage.

2. The auxiliary active clamp circuit as recited in claim 1 further comprising a protection circuit or said auxiliary clamp switch.

3. The auxiliary active clamp circuit as recited in claim 2 wherein said protection circuit comprises a diode.

4. The auxiliary active clamp circuit as recited in claim 2 wherein said protection circuit comprises a plurality of resistors.

5. The auxiliary active clamp circuit as recited in claim 1 wherein said main active clamp circuit is coupled across said main power switch.

6. The auxiliary active clamp circuit as recited in claim 1 wherein said rectifier switch is a synchronous rectifier switch.

7. For use with a power converter having a main active clamp circuit associated with a main power switch coupled to a primary winding of a transformer and a rectifier switch coupled to a secondary winding of said transformer, said main power switch configured to conduct during a main conduction period of said power converter and said rectifier switch configured to conduct during an auxiliary conduction period of said power converter, a method of clamping a voltage of said rectifier switch, comprising:

storing a clamping voltage substantially equal to an off-state voltage of said rectifier switch;

providing a drive signal from another secondary winding to an auxiliary clamp switch;

causing said auxiliary clamp switch to conduct during said main conduction period; and clamping a voltage across said rectifier switch at about said clamping voltage.

8. The method as recited in claim 7 further comprising providing a protection circuit for said auxiliary clamp switch.

9. The method as recited in claim 8 wherein said protection circuit comprises a diode.

10. The method as recited in claim 8 wherein said protection circuit comprises a plurality of resistors.

11. The method as recited in claim 7 wherein said main active clamp circuit is coupled across said main power switch.

12. The method as recited in claim 7 wherein said rectifier switch is a synchronous rectifier switch.

13. The method as recited in claim 7 wherein said power converter includes another rectifier switch and said method, further comprises:

storing a clamping voltage substantially equal to an off-state voltage of said another rectifier switch; and clamping a voltage across said another rectifier switch at about said clamping voltage.

14. A power converter, comprising:

a main power switch coupled to an input of said power converter;

a main active clamp circuit associated with said main power switch that conducts during a main conduction period of said power converter;

a transformer having a primary winding coupled to said main power switch;

a rectifier coupled to a secondary winding of said transformer and including a rectifier switch that conducts during an auxiliary conduction period of said power converter; and an auxiliary active clamp circuit, including:

an auxiliary clamp capacitor, coupled across said rectifier switch, that stores a clamping voltage substantially equal to an off-state voltage of said rectifier switch, and an auxiliary clamp switch, coupled in series with said auxiliary clamp capacitor, that receives a drive signal from another a secondary winding and conducts during said main conduction period thereby clamping a voltage across said rectifier switch at about said clamping voltage.

15. The power converter as recited in claim 14 further comprising a protection circuit for said auxiliary clamp switch.

16. The power converter as recited in claim 15 wherein said protection circuit comprises a parallel-coupled diode and resistor coupled to said auxiliary clamp switch.

17. The power converter as recited in claim 14 wherein said main active clamp circuit is coupled across said main power switch.

18. The power converter as recited in claim 14 wherein said rectifier switch is a synchronous rectifier switch.

19. The power converter as recited in claim 14 wherein said rectifier further comprises another rectifier switch and said power converter further comprises another auxiliary active clamp circuit, including:

another auxiliary clamp capacitor, coupled across said another rectifier switch, that stores a clamping voltage substantially equal to an off-state voltage of said another rectifier switch; and another auxiliary clamp switch, coupled in series with said another auxiliary clamp capacitor, that clamps a voltage across said another rectifier switch at about said clamping voltage.

20. The power converter as recited in claim 19 wherein a drive signal for said another auxiliary clamp switch is derived from another secondary winding of said transformer of said power converter.

* * * * *